(12) United States Patent
Hata et al.

(10) Patent No.: US 6,992,386 B2
(45) Date of Patent: Jan. 31, 2006

(54) SEMICONDUCTOR DEVICE AND A METHOD OF MANUFACTURING THE SAME

(75) Inventors: Toshiyuki Hata, Maebashi (JP); Hiroshi Sato, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/828,262

(22) Filed: Apr. 21, 2004

(65) Prior Publication Data

US 2005/0023670 A1    Feb. 3, 2005

(30) Foreign Application Priority Data

Jul. 31, 2003    (JP) ............................... 2003-204732

(51) Int. Cl.
H01L 23/48    (2006.01)
H01L 23/52    (2006.01)
H01L 29/40    (2006.01)

(52) U.S. Cl. ..................... 257/735; 257/690; 257/736; 257/737; 257/276; 257/341

(58) Field of Classification Search ........ 257/735–737, 257/706, 707, 711, 276, 780, 781, 783, 772, 257/787, 713, 775, 341, 796, 690
See application file for complete search history.

(56) References Cited

U.S. PATENT DOCUMENTS

| | | | | |
|---|---|---|---|---|
| 5,625,226 A | * | 4/1997 | Kinzer | ....................... 257/705 |
| 5,637,922 A | * | 6/1997 | Fillion et al. ............... | 257/728 |
| 6,222,738 B1 | * | 4/2001 | Maeno et al. ............... | 361/772 |
| 6,256,200 B1 | * | 7/2001 | Lam et al. ................... | 361/704 |
| 6,372,625 B1 | * | 4/2002 | Shigeno et al. ............. | 438/617 |
| 6,479,888 B1 | * | 11/2002 | Hirashima et al. .......... | 257/673 |
| 6,566,164 B1 | * | 5/2003 | Glenn et al. ................ | 438/107 |
| 6,777,800 B2 | * | 8/2004 | Madrid et al. .............. | 257/690 |
| 6,784,537 B2 | * | 8/2004 | Moriguchi .................. | 257/706 |
| 6,791,199 B2 | * | 9/2004 | Sakamoto et al. .......... | 257/787 |

FOREIGN PATENT DOCUMENTS

| | | |
|---|---|---|
| JP | 2000-223634 | 1/1999 |
| JP | 2003-86787 | 9/2001 |

* cited by examiner

Primary Examiner—Tom Thomas
Assistant Examiner—Chris C. Chu
(74) Attorney, Agent, or Firm—Reed Smith LLP; Stanley P. Fisher, Esq.; Juan Carlos A. Marquez, Esq.

(57) ABSTRACT

A semiconductor device to prevent breakage of a semiconductor chip is disclosed. The device incorporates a sealing member, a semiconductor chip and having a source and gate electrodes on a first main surface and a drain electrode on a second main surface, a first electrode plate having an upper surface exposed to an upper surface of the sealing member and a lower surface exposed to a lower surface of the sealing member, and second electrode plates each having a lower surface exposed to the lower surface of the sealing member. The drain electrode of the chip is electrically connected to the drain electrode plate through an adhesive. Stud type bump electrodes are formed by gold wire on the source and gate electrodes and are covered with an electrically conductive adhesive. The bump electrode(s) and the source and gate electrode plates are electrically connected with each other through the adhesive.

6 Claims, 14 Drawing Sheets

SEMICONDUCTOR DEVICE AND A METHOD OF MANUFACTURING THE SAME

CROSS-REFERENCE TO RELATED APPLICATION

The present application claims priority from Japanese Patent application JP 2003-204732 filed on Jul. 31, 2003, the content of which is hereby incorporated by reference into this application.

BACKGROUND OF THE INVENTION

The present invention relates to a semiconductor device and a method of manufacturing the same. Particularly, the present invention is concerned with a technique applicable effectively to the manufacture of a semiconductor device in which a semiconductor chip having a power transistor is sealed.

As a high output semiconductor device there is known a semiconductor device wherein a semiconductor chip having a power transistor such as, for example, a power MOSFET (Metal Oxide Semiconductor Field-Effect-Transistor), an IGBT (Insulated Gate Bipolar Transistor), or a bipolar power transistor is incorporated into a sealing member.

A power MOSFET device has a structure wherein a power MOSFET chip is incorporated into a sealing member. As a power MOSFET device there is known one having a structure wherein metallic members serving as drain terminals are exposed to the bottom of a sealing member formed of an insulating resin and a lead terminal for source and a lead terminal for gate are disposed on one side of the sealing member. The lead terminal for source and the lead terminal for gate are partially bent and exposed to an upper surface of the sealing member. Both lead terminals for source and gate are electrically connected respectively to a source electrode and a gate electrode on an upper surface of a semiconductor chip which is fixed onto the metallic member. These leads are ultrasonic compression-bonded to gold (Au) bumps which are arranged uniformly on the source and gate electrodes by a ball bonding method. (See, for example, Patent Literature 1.)

On the other hand, in connection with a method of manufacturing a power MOSFET of the same structure, there also is known a technique wherein gold bumps are formed at the stage of a semiconductor wafer and thereafter the semiconductor wafer is diced to form semiconductor chips each having gold bumps (see, for example, Patent Literature 2).

[Patent Literature 1]
Japanese Patent Application Laid-Open No. 2000-223634 (page 7, FIGS. 1 and 17)

[Patent Literature 2]
Japanese Patent Application Laid-Open No. 2003-86787 (page 4, FIG. 1)

SUMMARY OF THE INVENTION

In a power MOSFET device, electrodes on a semiconductor chip and leads (metallic sheets) are electrically connected to each other by solder. In this connection, a metallic compound is formed at the boundary of solder and each electrode, with consequent deterioration of the connection characteristic. To prevent formation of the metallic compound, an under-barrier metal layer (UBM layer) is formed by Ti (lower layer) and Ni.

However, since the UBM layer is formed by sputtering for example, an increase of the manufacturing cost results.

Therefore, front ends of wires are connected onto electrodes by a thermocompression bonding method, then the wires are pulled and broken to form stud type bump electrodes, and the bump electrodes are connected to lead terminals by an ultrasonic method (see, for example, Patent Literature 1).

In the ultrasonic connection, since the bump electrodes and the lead terminals are connected together in the form of metal-to-metal connection under ultrasonic oscillation in a heated state, the semiconductor chip with the bump electrodes formed thereon is pushed strongly against the lead terminals. As a result, the bump electrodes formed on electrodes on the semiconductor chip have a high strength because they are formed by wires. Thus, in the connection using the ultrasonic method, a large force is applied to the semiconductor chip. Consequently, the semiconductor chip formed by a fragile semiconductor element may be cracked or broken, or the breakage of MOSFET may result.

The power MOSFET device is of a structure (under-fill structure) wherein resin for forming a sealing member gets in between the surface of the semiconductor chip and the lead terminals. Therefore, it is necessary that between the semiconductor chip and the lead terminals there be a gap wide enough to permit easy entry thereof of a filler (silica) which is contained in the resin. In the case where an average particle diameter of the filler is, for example, 15 $\mu$m (75 $\mu$m cut), the said gap is required to be at least 50 $\mu$m or so. This is an obstacle to attaining the reduction in thickness of the power MOSFET device (semiconductor device).

It is an object of the present invention to provide a semiconductor device wherein the breakage of a semiconductor chip is difficult to occur and a method of manufacturing the same.

It is another object of the present invention to provide a thin semiconductor device and a method of manufacturing the same.

The above and other objects and novel features of the present invention will become apparent from the following description and the accompanying drawings.

Typical modes of the invention as disclosed herein will be outlined below.

(1) A semiconductor device according to the present invention comprises:

a sealing member formed of an insulating resin and having an upper surface and a lower surface as a surface and a back surface, respectively, and side faces connecting the upper and lower surfaces with each other;

a semiconductor chip positioned within the sealing member, the semiconductor chip having electrodes (source electrode and gate electrode) on a first main surface thereof and an electrode (drain electrode) on a second main surface thereof as a back surface opposite to the first main surface;

a first electrode plate (drain electrode plate) having an upper surface and a lower surface as a surface and a back surface, respectively, a part of the upper surface of the first electrode plate being exposed to the upper surface of the sealing member and the lower surface portions of end portions of the first electrode plate being exposed to the lower surface of the sealing member; and second electrode plates (source electrode plate and gate electrode plate) each having an upper surface and a lower surface as a surface and a back surface, respectively, the lower surface of each of the second electrode plates being exposed to the lower surface of the sealing member and the upper surface of each of the second electrode plates being positioned within the sealing member, wherein the electrode (drain electrode) on the second main surface of the semiconductor chip is electrically connected to the first electrode plate (drain electrode plate) through an adhesive, and one or plural stud type bump electrodes are formed on a surface of each of the electrodes (source electrode and gate electrode) on the first main surface of the semiconductor chip by a thermocompression bonding method (ball bonding method) using gold wire, the bump electrode(s) being covered with an electrically conductive adhesive (silver paste), the bump electrode(s) and each of the second electrode plates (source electrode plate and gate electrode plate) being electrically connected to each other through the adhesive.

An adhesive is interposed between the bump electrode(s) and each of the second electrode plates (source electrode plate and gate electrode plate) to keep the bump electrode(s) and the second electrode plates out of contact with each other. End portions of the electrode plates project about 0.1 to 0.2 mm to the exterior from side faces of the sealing member. Each end portion of the drain electrode plate branches to plural ends. The branched ends project to the exterior from side faces of the sealing member. An extending direction of the drain electrode plate and that of the source electrode plate and the gate electrode plate are different from each other. For example, the source electrode plate and the gate electrode plate extend in a direction orthogonal to the extending direction of the drain electrode. The electrodes on the semiconductor chip on which the bump electrodes are to be formed are formed by an aluminum film, and bump electrodes are formed on the aluminum film with use of gold wires. The spacing between the first main surface of the semiconductor chip on which the source electrode and the gate electrode are formed and the source and gate electrode plates is 10 to 30 $\mu$m.

Such a semiconductor device is manufactured by a method comprising the steps of:

(a) providing a first lead frame having a patterned, partially bent, first electrode plate (drain electrode plate) and a second lead frame having patterned, flat plate-like, second electrode plates (source electrode plate and gate electrode plate);

(b) providing a semiconductor chip, the semiconductor chip having electrodes (source electrode and gate electrode) on a first main surface thereof and electrodes (drain electrode) on a second main surface thereof opposite to the first main surface;

(c) connecting the drain electrode on the second main surface of the semiconductor chip to the first electrode plate (drain electrode plate) of the first lead frame electrically through an electrically conductive adhesive;

(d) connecting an electrically conductive wire onto each of the electrodes (source electrode and gate electrode) on the first main surface of the semiconductor chip by a thermocompression bonding method and pulling and thereby breaking the wire to form one or plural stud type bump electrodes;

(e) applying an electrically conductive adhesive onto the source electrode and the gate electrode so as to cover the bump electrodes;

(f) superimposing the second lead frame on the adhesive applied onto the bump electrodes and allowing the adhesive on the bump electrodes to cure to connect the source electrode plate of the second lead frame and the bump electrode(s) on the source electrode with each other electrically and further connect the gate electrode plate of the second lead frame and the bump electrode(s) on the gate electrode with each other electrically;

(g) covering the portion including the first and second lead frames, the semiconductor chip and the adhesive with an insulating resin in such a manner that outer surfaces of the electrode plates of the first and second lead frames are exposed, to form a sealing member; and (h) cutting off unnecessary portions of the first and second lead frames in the vicinity of the sealing member to let outer ends of the drain electrode plate, the source electrode plate and the gate electrode plate project about 0.1 to 0.2 mm from side faces of the sealing member.

In the above step (a) of providing the first and second lead frames, the first lead frame is formed in such a manner that lower surface portions of end portions of the first electrode plate (drain electrode plate) in the first lead frame are exposed to a lower surface of the sealing member and an upper surface of a central portion of the first electrode plate is exposed to an upper surface of the sealing member. The first and second lead frames are formed in such a manner that the source electrode plate and the gate electrode plate extend in a direction orthogonal to an extending direction of the drain electrode plate. In the lead frames, end portions of a wide electrode plate, out of the electrode plates of the lead frames, are each branched into plural end patterns, and the sealing member is formed so that the branched ends project to the exterior from side faces of the sealing member.

The electrodes on the semiconductor chip on which bump electrodes are to be formed are formed by an aluminum film, gold wires are connected onto the electrodes by a thermocompression bonding method and are cut off to form the bump electrodes, then silver paste as an adhesive is applied onto the electrodes so as to cover the bump electrodes, thereafter the electrode plates of the lead frames are superimposed on the adhesive, and the adhesive is cured to connect the electrode plates and the bump electrodes electrically with each other. In this case, the adhesive is formed thicker than the height of the bump electrodes so as to avoid direct contact of the bump electrodes with the electrode plates. The spacing between the first main surface of the semiconductor chip on which the bump electrodes are formed and the electrode plates (source electrode plate and gate electrode plate) which confront the first main surface of the chip should be about 10 to 30 $\mu$m. The thickness of the adhesive to be filled into the said spacing is determined so as to meet this requirement.

DETAILED DESCRIPTION OF PREFERRED EMBODIMENTS

Figure 1:
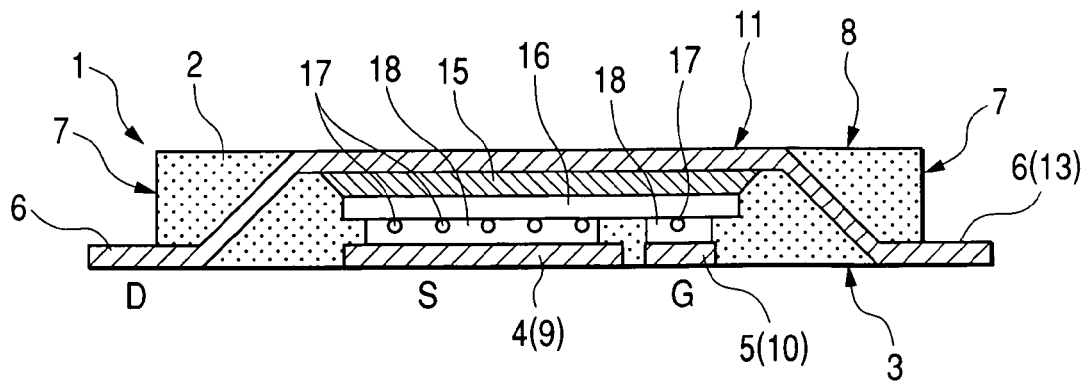
FIG. 1 is a schematic sectional view of a semiconductor device according to an embodiment (first embodiment) of the present invention.

Embodiments of the present invention will be described in detail hereinunder with reference to the accompanying drawings. In all of the drawings for illustrating the embodiments, portions having the same functions are identified by the same reference numerals, and repeated explanations thereof will be omitted.

(First Embodiment)

FIGS. 1 to 18(b) are concerned with a semiconductor device according to an embodiment (first embodiment) of the present invention, of which FIGS. 1 to 6 are related to the structure of the semiconductor device and FIGS. 7 to 18(b) are related to a method of manufacturing the semiconductor device.

In this first embodiment a description will be given of an example in which the present invention is applied to a power MOSFET device (semiconductor device). In the power MOSFET device is incorporated a semiconductor chip which forms a vertical power MOSFET. A source (S) electrode as a first electrode and a gate electrode (G) as a control electrode are provided on a first main surface of the semiconductor chip, while a drain (D) electrode as a second electrode is provided on a second main surface of the chip which is opposite to the first main surface.

Figure 4:
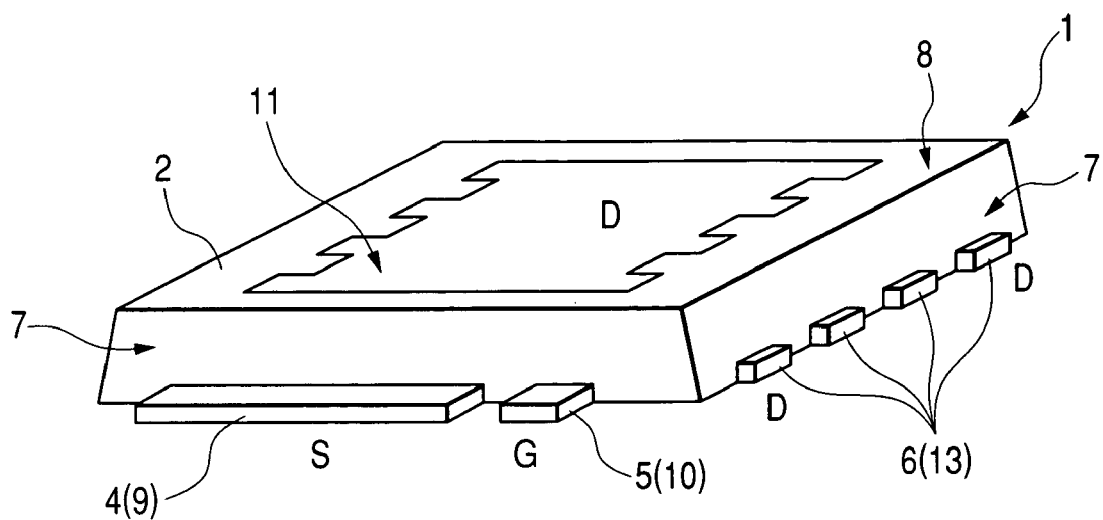
FIG. 4 is a schematic perspective view of the semiconductor device as seen from above obliquely.
Figure 5:
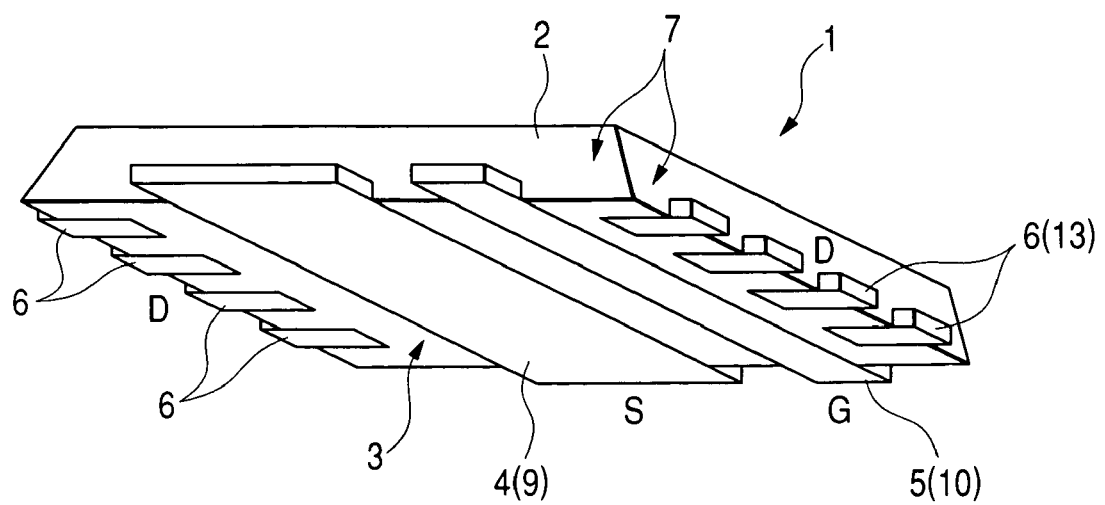
FIG. 5 is a schematic perspective view of the semiconductor device as seen from below obliquely.

As shown in FIGS. 1, 4 and 5, the power MOSFET device, indicated at 1, has a flat quadrangular sealing member (package) 2 formed of an insulating resin. A source electrode terminal 4, a gate electrode terminal 5 and drain electrode terminals 6, serving as external electrode terminals, are positioned on a lower surface 3 of the sealing member 2 in such a manner that respective lower surfaces are exposed. As shown in FIG. 5, the source electrode terminal 4, the gate electrode terminal 5 and the drain electrode terminals 6 project slight (for example, about 0.1 to 0.2 mm) from side faces 7 of the sealing member 6. Thus, the power MOSFET device 1 has a so-called non-lead structure.

The source electrode terminal 4 and the gate electrode terminal 5 constitute flat electrode plates 9 and 10, respectively, which extend in the width direction of the sealing member 2. Second surfaces of the electrode plates 9 and 10 are exposed from the lower surface 3 of the sealing member 2, while first surfaces thereof are buried in the sealing member 2. The length in the longitudinal direction of each of the source electrode terminal 4 and the gate electrode terminal 5 is 5 mm and the spacing between both electrode terminals is about 0.2 mm. The width of the source electrode terminal 4 is 1 mm and that of the gate electrode terminal 5 is 0.3 mm. As noted above, both longitudinal ends of the source electrode terminal 4 and the gate electrode terminal 5 project slightly from side faces of the sealing member 2.

As shown in FIG. 5, four drain electrode terminals 6 are arranged on the lower surface 3 of each of both ends of the sealing member 2. The drain electrode terminals 6 are constituted by a single electrode plate 13. As shown in FIGS. 1 and 4, an upper surface of a central portion of the electrode 13 is exposed to an upper surface 8 of the sealing member 2. At each of both ends of the central portion the electrode plate 13 branches to four branch portions, which branch portions are bent halfway. The bent portions are inclined and exposed to the lower surface 3 of the sealing member 2 in conformity with the said lower surface. Front ends of the branch portions project slightly from the side faces 7 of the sealing member 2. Heat dissipating fins are attached to a surface 11 of the central portion of the electrode plate 13.

In other words, the upper surface (first surface) of the central portion of the electrode plate 13 is exposed to the upper surface 8 of the sealing member 2, while a second surface (lower surface) thereof opposite to the first surface is positioned within the sealing member 2. Both first and second surfaces of the bent portions of the electrode plate 13 are positioned within the sealing member 2. Second surface portions (lower surface portions) of the front ends (end portions) of the branch portions are exposed to the lower surface of the sealing member 2 to form drain electrode terminals 6, while first surface portions (upper surface portions) as opposite surface portions of the branch portions' front ends are positioned within the sealing member 2.

On the other hand, a semiconductor chip 16 is fixed through an adhesive 15 to the second surface (lower surface in FIG. 1) of the central portion of the electrode plate 13. The semiconductor chip 16 is provided on a first main surface thereof with a source electrode and a gate electrode and is further provided on a second main surface thereof opposite to the first main surface with a drain electrode as a back electrode. The back electrode is connected electrically to the central portion of the electrode plate 13 through the adhesive 15. One or plural bump electrodes 17 are provided on each of the source electrode and the gate electrode. The bump electrodes 17 are covered with an electrically conductive adhesive 18 and are connected to the electrode plates 9 and 10 through the adhesive 18. As a result, the source electrode is electrically connected to the electrode plate 9 (source electrode terminal 4), while the gate electrode is electrically connected to the electrode plate 10 (gate electrode terminal 5).

In manufacturing the power MOSFET device 1 there are used two lead frames (first and second lead frames) as will be described later. The electrode plate 13 including the drain electrode terminals 6 is provided in one lead frame, while the electrode plates 9 and 10 which form the source electrode terminal 4 and the gate electrode terminal 5 are provided in the other lead frame.

In a lead frame providing step, the first lead frame is provided in such a manner that lower surface portions of end portions of a first electrode plate (drain electrode plate) of the first lead frame are exposed to the lower surface of the sealing member and an upper surface of a central portion of the first electrode plate is exposed to the upper surface of the sealing member. The first and second lead frames are provided so that the source electrode plate and the gate electrode plate extend in a direction orthogonal to an extending direction of the drain electrode plate. In the lead frames, moreover, a wide electrode plate, out of the electrode plates of the lead frames, is patterned so that its ends are each branched to plural end portions and so that the branched end portion project outwards from side faces of the sealing member. In this embodiment, both ends of the drain electrode plate are branched.

Figure 6:
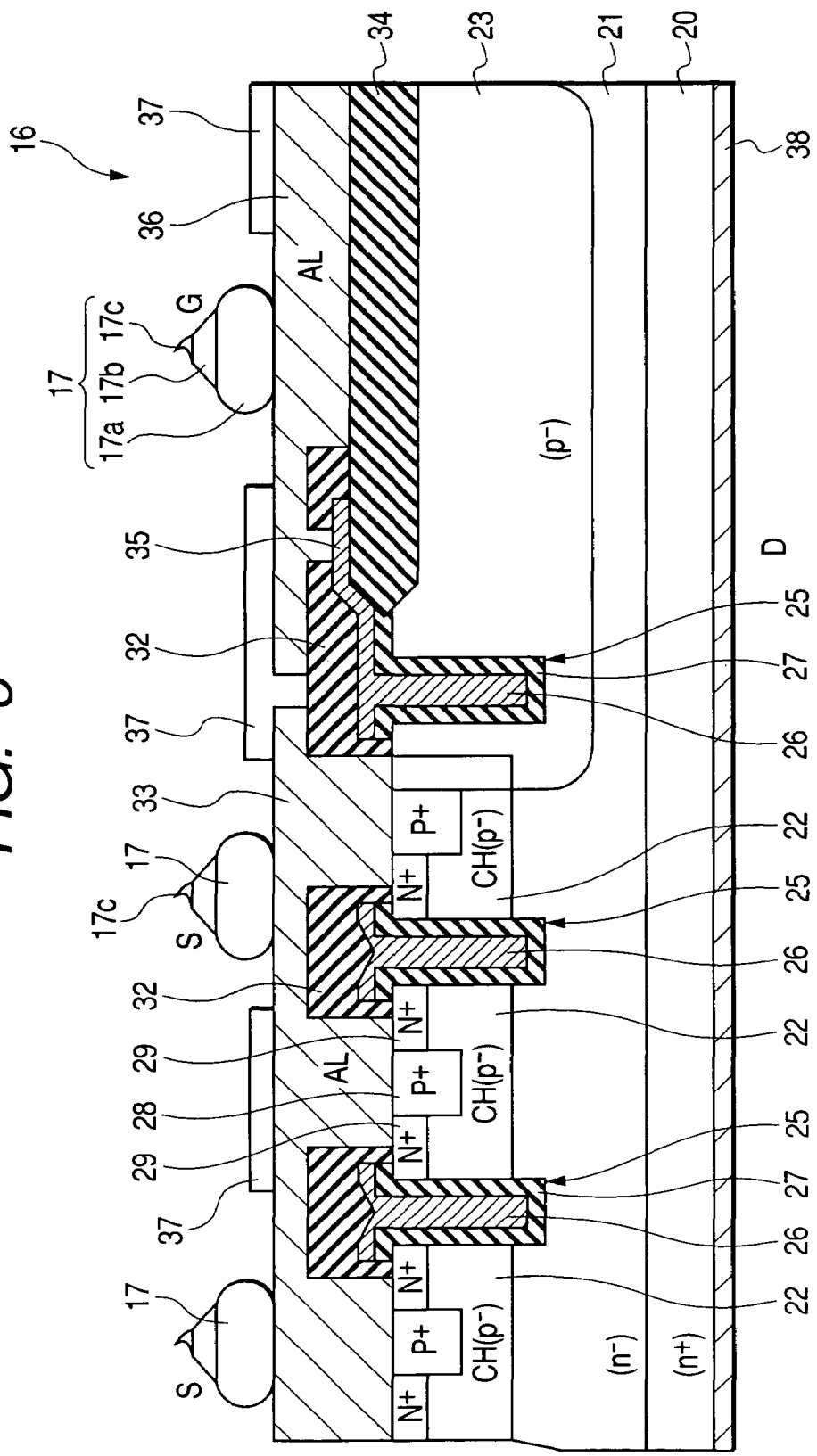
FIG. 6 is a schematic enlarged sectional view showing a part of a semiconductor chip incorporated in the semiconductor device.
Figure 7:
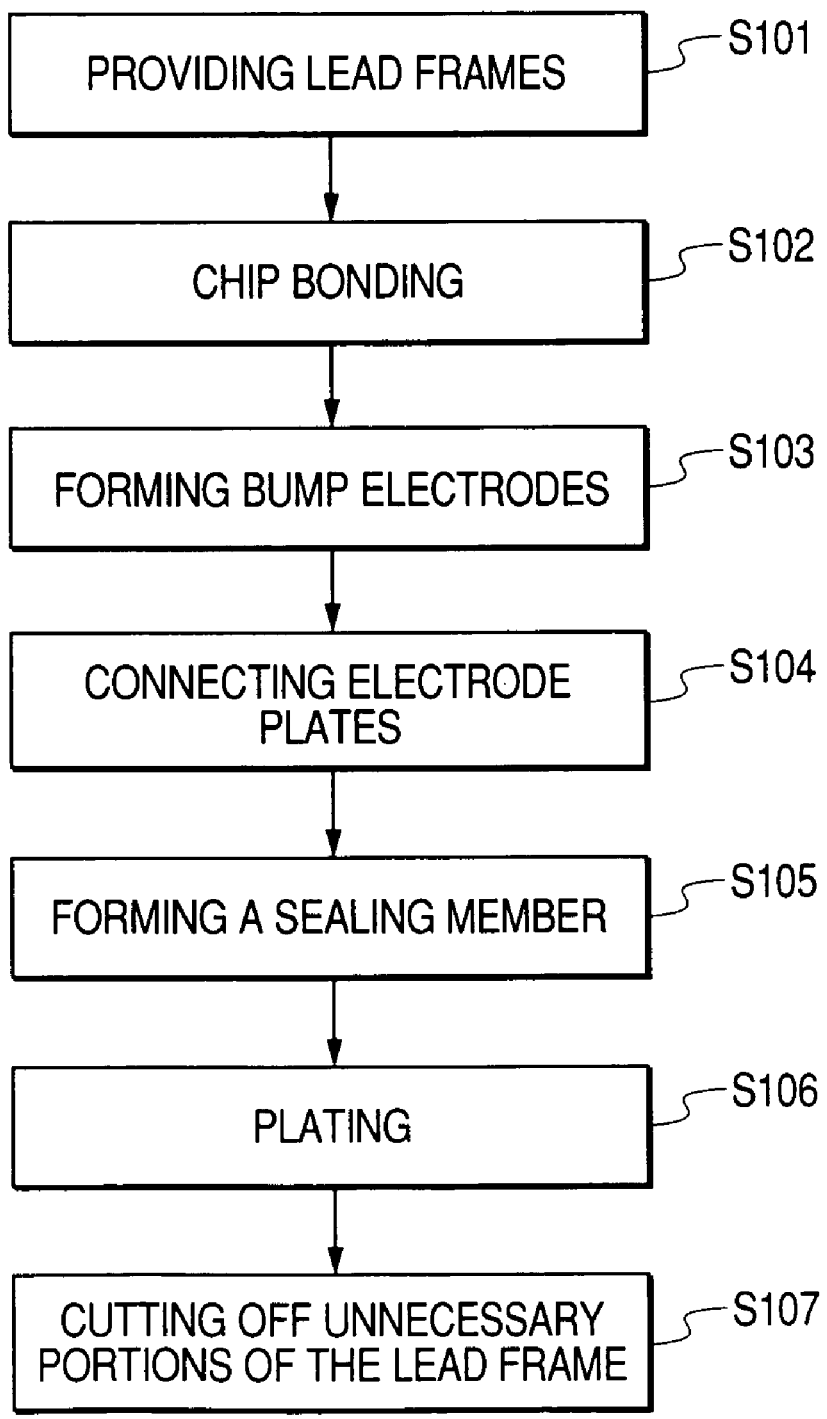
FIG. 7 is a flow chart showing a method of manufacturing the semiconductor device.

The structure of the semiconductor chip 16 will be described below briefly with reference to FIG. 6. FIG. 6 is an enlarged sectional view of a part of the semiconductor chip 16, showing a part of a vertical power MOSFET.

The semiconductor chip 16 is formed using an n$^+$ type silicon semiconductor substrate 20 which is provided on a main surface thereof with an n$^-$ type epitaxial layer 21. In the vertical MOSFET, when seen in plan, a large number of cells (transistors) are arranged in regular order. In the illustrated example, each transistor cell has a trench configuration. A p$^-$ type channel (CH) layer 22 is formed in a predetermined region of the epitaxial layer 21 and a p$^-$ type well layer 23 as a guard ring is formed around the channel layer 22.

A large number of trenches are formed in the cell-forming regions so as to extend through the channel layer 22. The trenches 25 are also formed in the well layer 23. The area between the trenches formed in the well layer 23 and the trenches which constitute cells positioned inside the well layer trenches and at an outermost periphery of the channel layer is an invalid area not used as cells.

A polysilicon gate layer 26 serving as a gate electrode is formed in each trench 25 and a gate insulating film 27 is formed below the polysilicon gate layer 26. Further, a P$^+$ region 28 is formed in a central surface layer portion of the channel layer 22 surrounded with trenches. In the channel layer 22 corresponding to cell portions, an N$^+$ type source region 29 is formed in a region from outside the P$^+$ region 28 up to a trench. Each trench portion, i.e., the gate insulating film 27 and polysilicon gate layer 26 are covered with an insulating layer 32 and a source electrode 33 is formed on the insulating film 32. In an opening portion free of the insulating film 32, the source electrode 33 is electrically connected to the P$^+$ region 28 and the source region 29.

In each trench portion 25 positioned outside the invalid area, a thick insulating film (LOCOS) 34 is provided contiguously to the gate insulating film 27. Though not shown, the thick insulating film 34 extends beyond the outer periphery of the well layer 23. The polysilicon gate layer 26 buried in each trench positioned outside the invalid area extends halfway on the insulating film 34 and forms a peripheral gate wiring 35. The peripheral gate wiring 35 and the thick insulating film 34 are also covered with the insulating film 32. A gate electrode 36 is provided from the insulating film 32 to the thick insulating film 34. The gate electrode 36 is electrically connected to the polysilicon gate layer 26 through an aperture formed partially in the insulating film 32. The source electrode 33 and the gate electrode 36 are each formed by an aluminum film.

An insulating film 37 is formed selectively on the first main surface of the semiconductor chip 16. The source electrode 33 and the gate electrode 36 are covered selectively with the insulating film 37. Further, bump electrodes 17 are formed in an opening portion free of the insulating film 37. A drain electrode 38 is formed throughout the second main surface of the semiconductor chip 16.

For example, the bump electrodes 17 are formed in the following manner. Wire (gold wire) is held by a cylindrical capillary and the tip of the wire projecting from the lower end of the capillary is sphered into a ball by electric discharge for example. Thereafter, the capillary is brought down onto an electrode surface of the semiconductor chip and the wire is connected to the electrode while crushing the ball. Next, the capillary is raised and the wire is clamped and pulled upward, whereby the wire is broken and a nail head-like bump electrode 17 is formed.

The tip of the broken portion of the bump electrode 17 is torn off and so becomes thinner suddenly (broken portion 17b) as shown in FIG. 6. Further, the tip of the broken portion 17b becomes beard-like (beard portion 17c). The height of a nail head portion 17a formed by crushing the ball with the capillary is ±3 μm or so and thus does not vary so much, while the height of the broken portion 17b varies greatly. Since the beard portion 17c is extremely thin, it is low in mechanical strength and bends easily even upon contact with an electrode plate, with no fear of damage to the semiconductor chip.

As an example, in the case of a gold wire having a diameter of 25 μm, the diameter of a ball portion is 75 to 80 μm and a maximum height of each bump electrode 17 is 30 μm or so. In this case, the height including both nail head portion 17a and broken portion 17b is 10 μm or so.

Therefore, if the thickness of the adhesive 18 is set larger than 30 μm which is the maximum value of variations, most of the bump electrodes 17 no longer come into contact with the electrode plate. If the thickness of the adhesive 18 is set at a value of about 10 to 30 µm, a strong force is not exerted on the semiconductor chip even upon contact of the beard portion 17c as an easy-to-bend portion with the semiconductor chip, so that the semiconductor chip can be prevented from damage. The smaller the thickness of the adhesive 18, the smaller can be made in thickness of the sealing member 2. For attaining the reduction in thickness of the power MOSFET 1 it is necessary to reduce the thickness of the sealing member 2 and of the adhesive 18.

Figure 2:
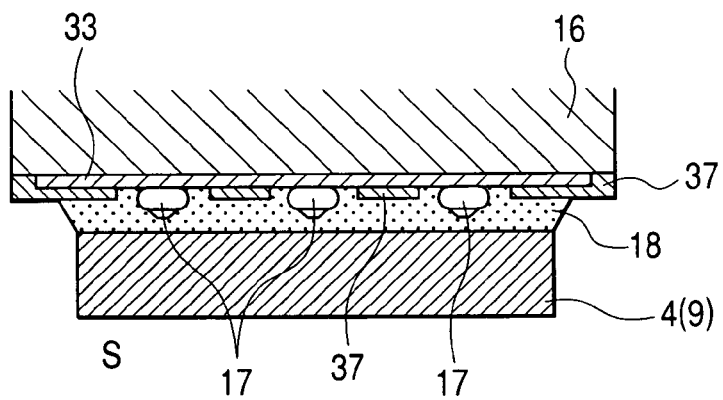
FIG. 2 is a schematic enlarged sectional view showing a state of connection of source electrode portion in the semiconductor device.
Figure 3:
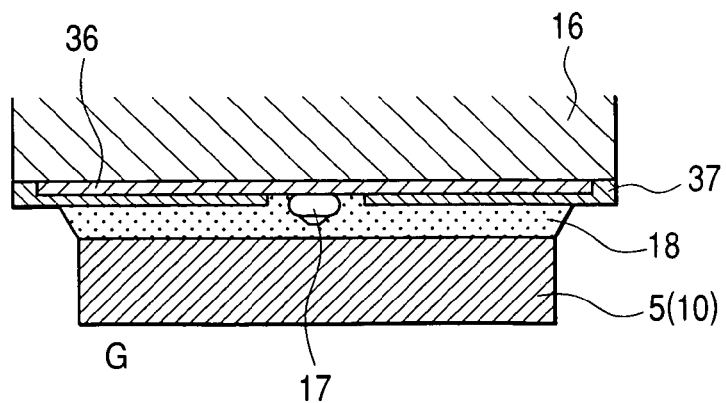
FIG. 3 is a schematic enlarged sectional view showing a state of connection of a gate electrode portion in the semiconductor device.

In FIGS. 1 to 3 there are shown a state of connection between the source electrode terminal 4 (electrode plate 9) and the bump electrodes 17 on the source electrode 33 through the adhesive 18 and a state of connection between the gate electrode terminal 5 (electrode plate 10) and the bump electrodes 17 on the gate electrode 36 through the adhesive 18.

FIG. 2 is a sectional view taken in the depth direction of FIG. 1, showing a state of connection between the source electrode terminal 4 (electrode plate 9) and the bump electrodes 17 on the source electrode 33 through the adhesive 18. The adhesive 18 is applied so as to extend substantially in the overall length of the semiconductor chip 16 and the bump electrodes 17 are arranged in the extending direction of the adhesive. FIG. 2 is a schematic diagram, showing three bump electrodes 17. The bump electrodes 17 are connected to the source electrode terminal 4, i.e., the source electrode plate, through the adhesive 18.

FIG. 3 is a sectional view taken in the depth direction of FIG. 1, showing a state of connection between the gate electrode terminal 5 (electrode plate 10) and the bump electrodes 17 on the gate electrode 36 through the adhesive 18. The gate electrode 36 is covered with the insulating film 37 except its central portion. For example, one bump electrode 17 is formed on the exposed surface portion of the gate electrode 36 and is connected to the gate electrode terminal 5, i.e., the gate electrode plate, through the adhesive 18. As is seen from FIGS. 1 and 3, the adhesive 18 is present on the whole surface of the gate electrode plate (electrode plate 10) to connect the gate electrode plate and the semiconductor chip 16 with each other.

The present invention includes in one aspect thereof a configuration wherein the bump electrodes 17 are not in contact with an electrode plate at all and in another aspect thereof a configuration wherein the beard portion 17c of each bump electrode 17 is in contact with an electrode plate.

This first embodiment is of the configuration wherein the bump electrodes 17 are not in contact with an electrode plate at all and the thickness of the adhesive 18 is about 30 µm. In the power MOSFET device 1 of this first embodiment, it is not necessary to let the filler which constitutes the sealing member get in (gap) between the first main surface of the semiconductor chip and an electrode plate as in the prior art, thus making it possible to reduce the thickness. More particularly, in the case where the filler is allowed to get into the above gap, it is necessary that the spacing of the gap be made as wide as 50 µm or more, while in this first embodiment the gap can be made as small as 30 µm. Consequently, the thickness of the sealing member 2 can be so much reduced and it is possible to attain the reduction in thickness of the power MOSFET device 1. The beard portion of each bump electrode 17 is omitted in the other figures than FIG. 6. In some of the figures, the bump electrodes 17 are represented merely by small circles.

In this first embodiment, such an expensive under-barrier metal layer as in the prior art need not be formed because the stud type bump electrodes 17 are formed on electrodes. In the structure where electrodes and an electrode plate are bonded together through the adhesive 18 (silver paste), it is necessary that an expensive under-barrier metal layer (UBM layer) be formed on the surface of each electrode, or else it will be impossible to effect the connection. In this first embodiment, however, since the bump electrodes 17 are interposed between the electrodes and the electrode plate, it is not necessary to form a UBM layer and it is possible to reduce the manufacturing cost.

Next, a method for manufacturing the semiconductor device (power MOSFET device) 1 of this first embodiment will be described with reference to FIGS. 7 to 18(b). As shown in the flow chart of FIG. 7, the power MOSFET 1 of this first embodiment is manufactured through the steps of providing lead frames and a semiconductor chip (S101), chip bonding (S102), forming bump electrodes (S103), connecting electrode plates (S104), forming a sealing member (S105), plating (S106), and cutting off unnecessary portions of the lead frames (S107).

Figure 8A:
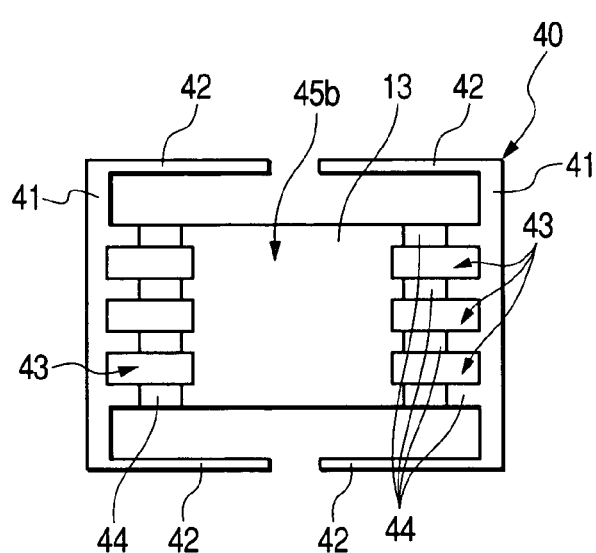
FIGS. 8(a) and 8(b) are a schematic plan view and a schematic sectional view of a lead frame used in manufacturing the semiconductor device.
Figure 8B:
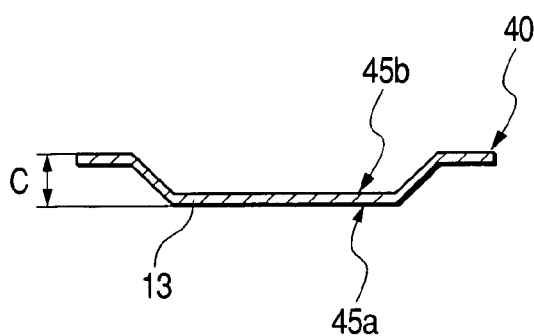
Figure 14:
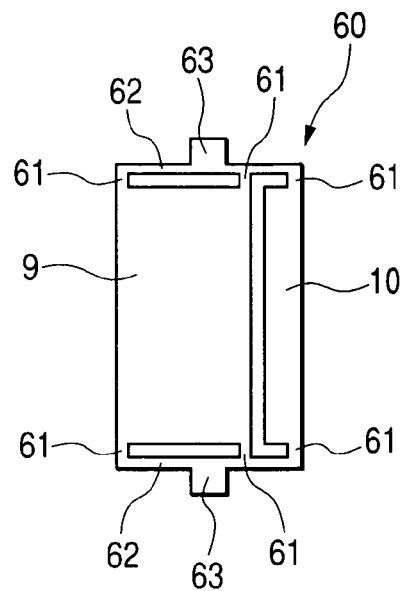
FIG. 14 is a schematic plan view of the electrode frame.

In manufacturing the power MOSFET 1, first and second lead frames and a semiconductor chip are provided (S101). FIGS. 8(a) and 8(b) are a plan view and a sectional view showing a first lead frame (a lead frame having an electrode plate 13) 40. FIG. 14 illustrates a second lead frame (a lead frame having electrode plates 9 and 10) 60. In these figures and the figures which follow, as to each of the lead frames 40 and 60, there is shown only a unit lead pattern for manufacturing one power MOSFET device 1, although actually a plurality of unit lead patterns are arranged in series through connecting frames, etc.

As shown in FIGS. 8(a) and 8(b), the first lead frame 40 (also designated merely lead frame 40) includes a pair of frame pieces 41 extending in parallel, a wide electrode plate 13 which connects the frame pieces 41 with each other, and clamp pieces 42 extending outside the electrode plate 13 and in a cantilevered state from the pair of frame pieces 41. Three slits 43 are formed side by side in each of both end portions of the electrode plate 13, i.e., portions close to the frame pieces 41. With the slits 43, four branch pieces 44 are formed on each of both end sides of the electrode plate 13. As shown in FIG. 4, the branch pieces 44 are portions serving as drain electrode terminals 6. With the extended structure of the pair of frame pieces 41, there is obtained a strip-like lead frame having plural unit lead patterns.

As an example of a dimensional relation, the width of each branch piece 44 is 0.4 mm and that of each slit 43 is 0.87. The longitudinal length of the central portion as a flat plate portion is 4.21 mm and the transverse length thereof is 3.11 mm. A semiconductor chip is mounted on this portion. The lead frame 40 is formed by a copper alloy plate and is 0.2 mm thick.

As shown in FIG. 8(b), the electrode plate 13 is bent downward at the portions of the slits 43. In FIG. 8(b), an upper surface of the lowered portion (offset portion) of the electrode plate is designated a second surface 45b and the back side is designated a first surface 45a. The distance c between the second surface 45b which is the highest and the first surface 45a which is the lowest, of the lead frame 40, is 0.6 mm for example. This height, i.e., thickness, corresponds to the thickness of the sealing member 2. In the state of the power MOSFET 1 device 1, the first surface 45a is an upper surface and the second surface 45b is a lower surface. The first and second surfaces 45a, 45b are used in explanation during manufacture of the power MOSFET device 1.

Figure 9A:
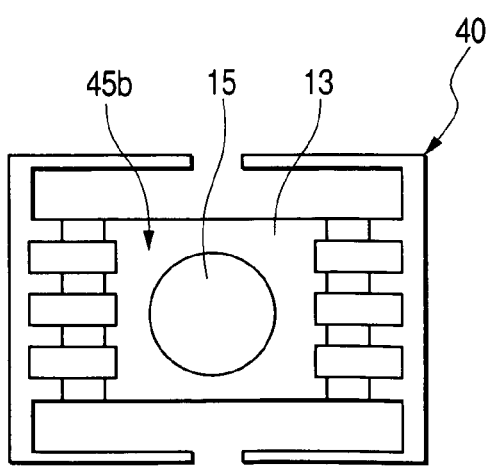
FIGS. 9(a) and 9(b) are a schematic plan view and a schematic sectional view of the lead frame with an adhesive applied to a chip fixing portion.
Figure 9B:
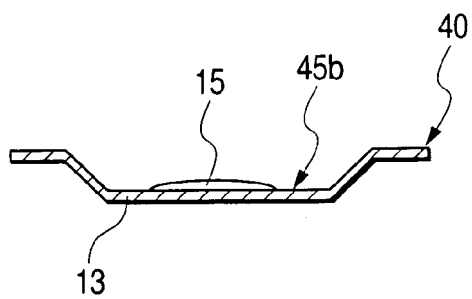
Figure 10A:
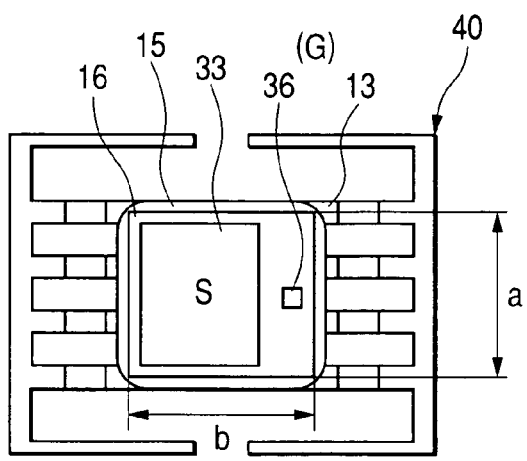
FIGS. 10(a) and 10(b) are a schematic plan view and a schematic sectional view of the lead frame with a semiconductor chip fixed to the chip fixing portion.
Figure 10B:
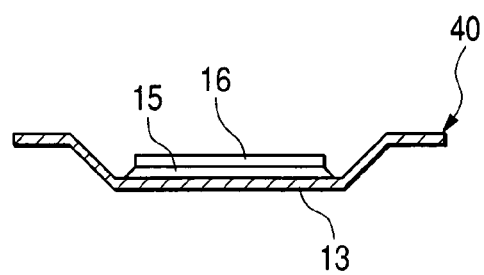

Next, as shown in FIGS. 9(a) and 9(b), an electrically conductive adhesive 15 is applied onto the second surface 45b of the electrode plate by means of a dispenser (not shown). Thereafter, a semiconductor chip 16 is superimposed on the adhesive 15 and the adhesive 15 is cured to fix the semiconductor chip 16 to the electrode plate 13 (S102), as shown in FIGS. 10(a) and 10(b). For example, silver paste is used as the adhesive and is cured by baking. The thickness of the adhesive 15 after curing is, for example, 0.01 mm. The semiconductor chip 16 has a length of a and a width of b. For example, a=3.9 mm and b=2.8 mm. In the semiconductor chip 16, a drain electrode surface is electrically connected to the electrode plate 13 through the electrically conductive adhesive 15. Thus, as shown in FIG. 10(a), a source electrode 33 and a gate electrode 36 are positioned on an exposed surface of the semiconductor chip 16. The gate electrode 36 is a small quadrangular region. As shown in FIG. 10(a), the source electrode 33 may be a wide quadrangular region, or may be of such a structure as shown in FIGS. 2 and 6 in which the area not formed with bump electrodes 17 is covered with an insulating film.

Figure 11A:
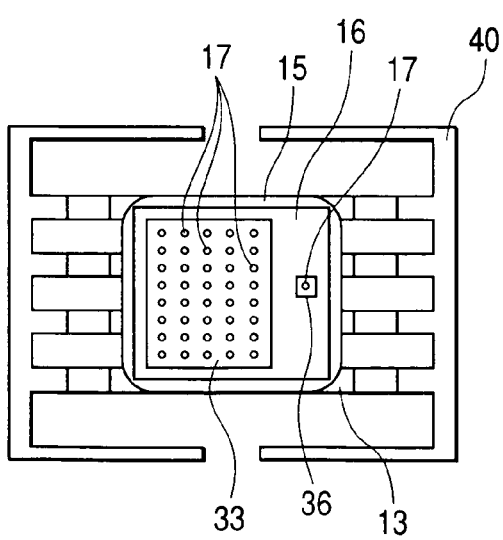
FIGS. 11(a) and 11(b) are a schematic plan view and a schematic sectional view of the lead frame with plural bump electrodes formed on a surface of the semiconductor chip.
Figure 11B:
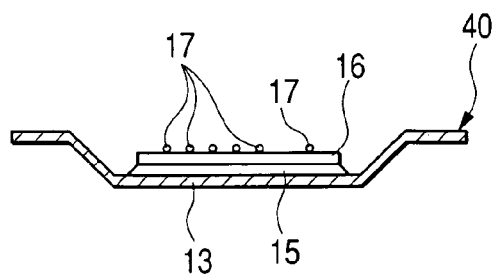

Next, as shown in FIGS. 11(a) and 11(b), bump electrodes 17 are formed on the source electrode 33 and the gate electrode 36 (S103). For example, one bump electrode 17 is formed on the gate electrode 36 and plural bump electrodes 17 are formed on the source electrode 33. As described earlier, the bump electrodes 17 are each formed in the following manner. Wire (gold wire) is held by a cylindrical capillary and the tip of the wire projecting from the lower end of the capillary is sphered into a ball by electric discharge for example. Thereafter, the capillary is brought down onto an electrode surface on the semiconductor chip and the wire is connected to the electrode while crushing the ball portion. Next, the capillary is raised and the wire is clamped and pulled upward. As a result, the wire is broken and there is formed a nail head-like bump electrode (stud type bump electrode) 17. The height of the bump electrode 17 is about 30 $\mu$m. A nail head portion 17a and a broken portion 17b can each be restricted to 5 $\mu$m or so. A beard portion 17c can also be restricted to 20 $\mu$m or less.

Figure 12A:
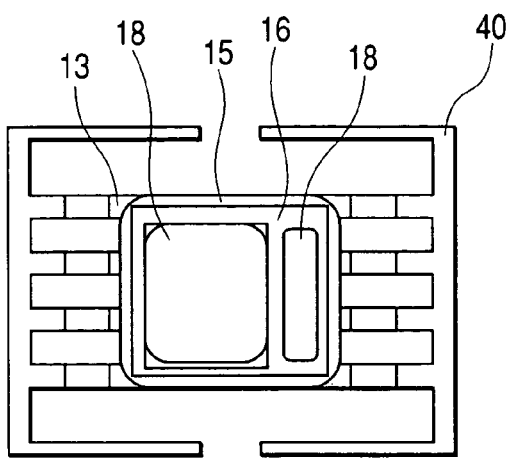
FIGS. 12(a) and 12(b) are a schematic plan view and a schematic sectional view of the lead frame with an adhesive applied to each of the source electrode portion and the gate electrode portion on the surface of the semiconductor chip.
Figure 12B:
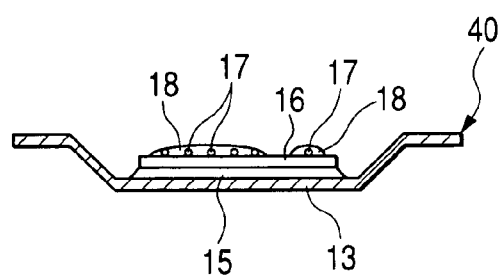

Next, as shown in FIGS. 12(a) and 12(b), an electrically conductive adhesive 18 is applied onto the source electrode 33 and the gate electrode 36 by means of a dispenser (not shown). As a result, a lump of adhesive 18 is formed on each of the source electrode 33 and the gate electrode 36, and the adhesive 18 covers the bump electrodes 17. As the adhesive 18, silver paste is used for example.

Figure 13A:
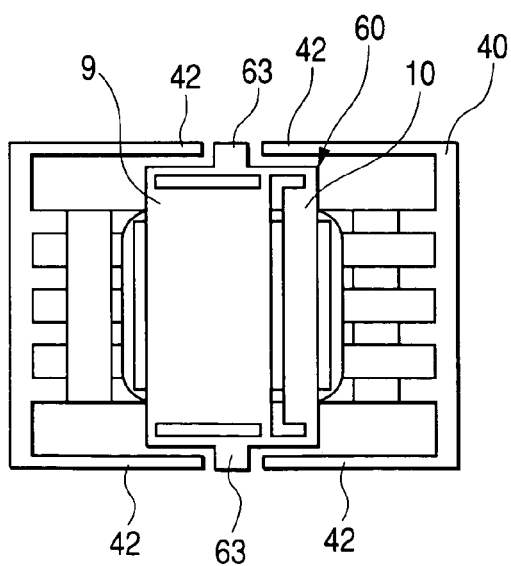
FIGS. 13(a) and 13(b) are a schematic plan view and a schematic sectional view of the lead frame with an electrode frame bonded to the source electrode portion and the gate electrode portion.
Figure 13B:
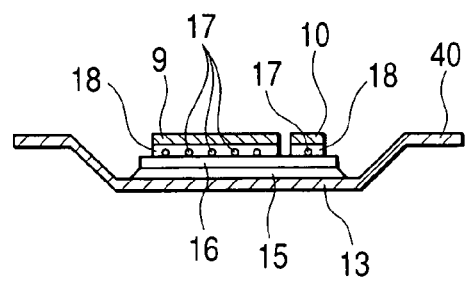

Then, as shown in FIGS. 13(a) and 13(b), the second lead frame 60 shown in FIG. 14 is superimposed and fixed onto the adhesive 18 on the source electrode 33 and the gate electrode 36 (S104). The lead frame 60 has electrode plates 9 and 10 having widths corresponding to the source electrode 33 and the gate electrode 36, respectively, of the semiconductor chip 16. The electrode plates 9 and 10 have a length such that both ends in their extending direction extend up to the outside of the semiconductor chip 16. Both said ends are then connected to frame portions 62 through connecting portions 61. Fitting pieces 63 project outwards of the frame portions 62.

A unit lead pattern of the second lead frame 60 is composed of a pair of frame portions 62, the electrode plates 9 and 10 extending in parallel between the frame portions 62 through connecting portions 61, and the fitting pieces 63 formed at centrally outside positions of the frame portions 62. By arranging the unit lead pattern repeatedly so as to be interconnected through the fitting pieces 63, there is formed a strip-like lead frame corresponding to the first lead frame 40.

FIG. 13(a) is depicted as if there were a gap between each fitting piece 63 and front ends of the associated pair of clamp pieces 42 of the lead frame 40. However, when the lead frame 60 is positioned and fitted onto the lead frame 40, each fitting piece 63 is fitted in between the associated pair of clamp pieces 42 and is fixed thereby. In this fixed state, the electrode plates 9 and 10 are not directly in contact with the bump electrodes 17. The space between the electrode plate 9 and the source electrode 33 and the space between the electrode plate 10 and the gate electrode 36 are filled with the adhesive 18. The spacing between a main surface of the semiconductor chip 16 having the source electrode 33 and the gate electrode 36 and the electrode plates 9, 10 is 30 $\mu$m or so.

Figure 15A:
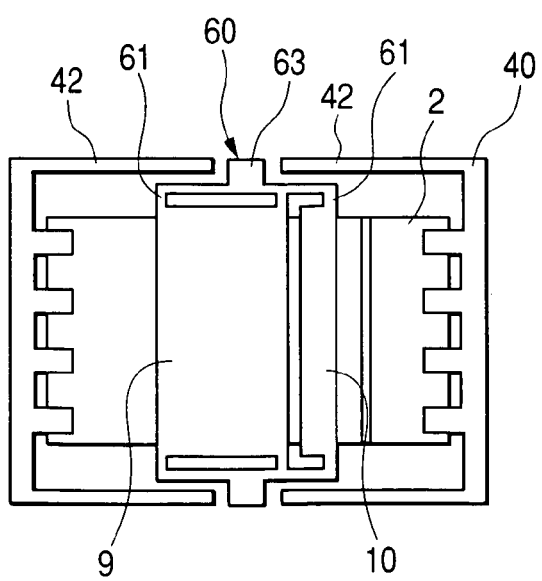
FIGS. 15(a) and 15(b) are a schematic plan view and a schematic sectional view of the lead frame with a sealing member formed thereon by transfer molding.
Figure 15B:
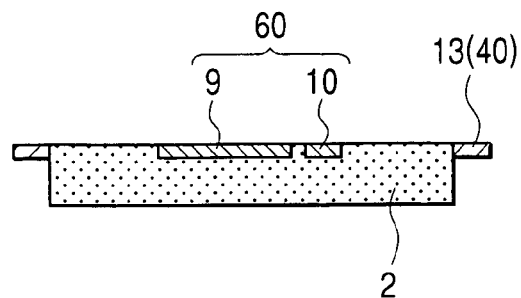

Next, as shown in FIGS. 15(a) and 15(b), a sealing member 2 is formed (S105). More specifically, the portion including the lead frames 40, 60, the semiconductor chip 16 and the adhesives 15, 18 is covered with an insulating resin to form a sealing member 2.

Figure 16:
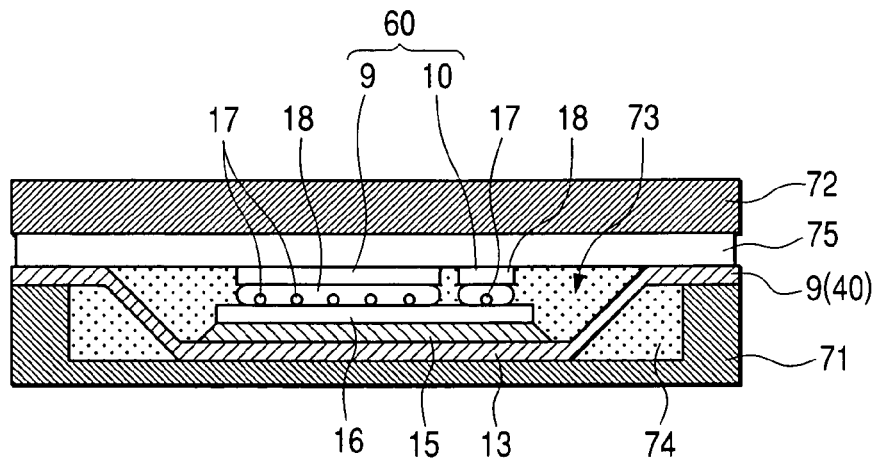
FIG. 16 is a schematic sectional view showing a state of transfer molding for the lead frame.

FIG. 16 is a schematic sectional view showing a state in which the sealing member 2 has been formed by a transfer molding apparatus. The lead frame 40, etc. after the completion of assembly are clamped between an upper die half 71 and a lower die half 72 of a molding die. Thereafter, an insulating resin 74 is injected into a cavity 73 from a gate (not shown) and is cured. In the illustrated example, the sealing member is formed by a sheet molding method wherein a highly elastic sheet 75 is interposed between parting surfaces of the lower die half 71 and the upper die half 72. According to this method, the sheet 75 is compressed elastically during molding, so that the leakage of resin does not occur and a strong force is not exerted on the semiconductor chip 16, whereby it is possible to prevent damage of the semiconductor chip.

During clamping of the lead frame 40, etc. between the upper and lower die halves, the central portion of the electrode plate 13 comes into contact with the bottom of the lower die half 71 and the electrode plates 9 and 10 of the lead frame 60 come into contact with the sheet 75. Further, both ends of the electrode plate 13 of the lead frame 40 come into contact with the sheet 75. Consequently, the central portion of the electrode plate 13 of the lead frame 40 is exposed to one surface of the sealing member 2, while the electrode plates 9 and 10 of the lead frame 60 and both end portions of the electrode plate 13 are exposed to the other surface of the sealing member 2 opposite to the one surface.

In this embodiment, the sealing member 2 is in a quadrangular shape having four side faces 7. End portions of the first electrode plates (source electrode plate and gate electrode plate) project from a pair of opposed side faces of the sealing member 2, while end portion of the second electrode plate (drain electrode plate) project from the other pair of side faces intersecting the aforesaid pair of side faces. During transfer molding, therefore, electrode plates project from both sides or both ends of the cavity in the molding die and are clamped positively by the lower die half 71 and the upper die half 72. As a result, the electrode plates are put in close contact with the bottom- or ceiling-side sheet in the cavity, preventing the leakage of resin to the exposed electrode plate surface portions.

In this embodiment, since the gap between the first main surface of the semiconductor chip 16 and the electrode plates 9, 10 is filled with the adhesive 18, aside from the gap between the electrode plates 9 and 10, it is not necessary to inject the insulating resin 74 into the gap. Therefore, it is not necessary to set the size of the said gap to a value large enough to permit entry therein of the filler contained in the resin, for example, 50 µm or more. The size of the said gap can be set at a value of about 10 to 30 µm and hence it is possible to reduce the thickness of the sealing member 2, which thickness can be reduced to, for example, 0.6 mm.

Next, though not shown, a plating film for mounting is formed by plating on the surfaces of the electrode plates 9, 10 and 13 projecting from the sealing member (S106). For example, PbSn film is formed as the plating film.

Figure 17A:
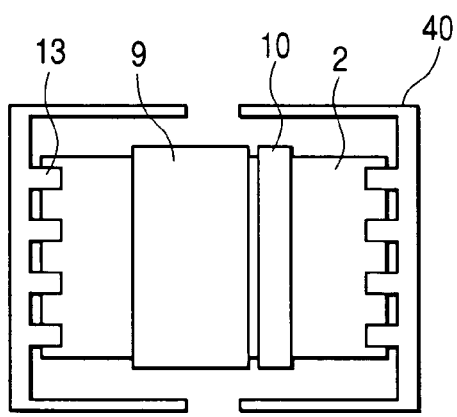
FIGS. 17(a) and 17(b) are a schematic plan view and a schematic sectional view of the lead frame after cutting off of unnecessary portions of the electrode frame.
Figure 17B:
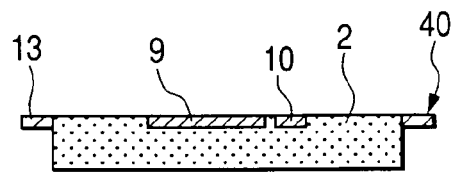

Then, unnecessary lead frame portions are cut off (S107) to fabricate such a power MOSFET device 1 as shown in FIGS. 1, 4 and 5. FIGS. 17(*a*) and 17(*b*) illustrate the lead frame 60 after cutting off of unnecessary portions thereof. More specifically, FIGS. 17(*a*) and 17(*b*) illustrate a state in which the connecting portions 61 at both ends of the electrode plates 9 and 10 have been removed by cutting. Front ends of the electrode plates 9 and 10 slightly project about 0.1 to 0.2 mm from side faces of the sealing member 2. The electrode plates 9 and 10 serve as a source electrode terminal 4 and a gate electrode terminal 5, respectively.

Figure 18A:
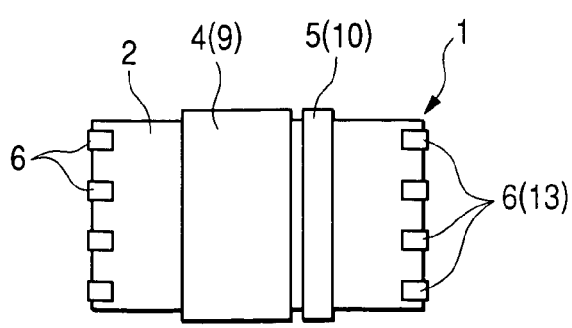
FIGS. 18(a) and 18(b) are a schematic bottom view and a schematic sectional view of a semiconductor device obtained as product by the aforesaid cutting off of unnecessary portions of the lead frame.
Figure 18B:
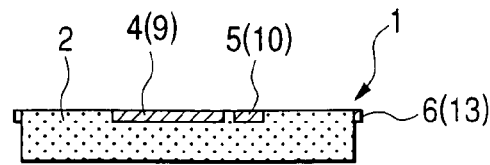

FIGS. 18(*a*) and 18(*b*) illustrate the lead frame 40 after cutting off of unnecessary portions thereof. More specifically, FIGS. 18(*a*) and 18(*b*) illustrate a state in which the branch pieces 44 at both ends of the electrode plate 13 of the lead frame 40 have been cut off halfway to remove unnecessary portions of the lead frame 40. Front ends of the branch pieces 44 slightly project 0.1 to 0.2 mm from side faces of the sealing member 2. The branch pieces 44 each serve as a drain electrode terminal 6. The power MOSFET device 1 is fabricated by this cutting off operation. FIG. 18(*a*) is a bottom view of the power MOSFET device 1 and FIG. 18(*b*) is a front view of the power MOSFET device 1 in an inverted state.

The following effects are attained by this first embodiment.

(1) According to this first embodiment, one or plural stud type bump electrodes 17 are formed on each of electrodes (source electrode 33 and gate electrode 36) formed on the first main surface of the semiconductor chip 16. Next, an adhesive (silver paste) 18 is formed in each electrode region so as to cover the bump electrodes 17 completely. Then, a source electrode plate (electrode plate 9) and a gate electrode plate (electrode plate 10) are superimposed on the source electrode 33 and the gate electrode 36, respectively, and the silver paste 18 on the source electrode and the gate electrode is cured by baking, whereby the bump electrode(s) 17 on the source electrode and the source electrode plate (electrode plate 9) are electrically connected together through the adhesive 18 and the bump electrode(s) 17 on the gate electrode and the gate electrode plate (electrode plate 10) are electrically connected together through the adhesive 18. Since the bump electrodes 17 high in strength are not strongly abutted against the electrode plates 9 and 10, it is possible to effect connection between the electrodes and the electrode plates without exertion of any strong force on the semiconductor chip 16. Consequently, the semiconductor chip 16 is neither cracked nor broken and so a highly reliable power MOSFET device (semiconductor device) 1 can be manufactured in high yield.

(2) As described in the above (1), since the power MOSFET device 1 of this first embodiment uses the stud type bump electrodes 17, it is no longer necessary to use an under-barrier metal layer heretofore adopted and it is possible to reduce the cost of the power MOSFET device 1.

(3) In this first embodiment, the adhesive 18 is present on the bump electrodes 17 formed on the electrodes of the semiconductor chip 16, and the electrode plates 9,10 and the bump electrodes 17 (source electrode 33 and gate electrode 36) are connected together through the adhesive 18. The space between the first main surface of the semiconductor chip 16 and the electrode plates 9, 10 is filled with the adhesive 18 completely in required regions, so that the space between the first main surface of the semiconductor chip 16 and the electrode plates is no longer required to be filled with the filler that constitutes the sealing member 2. Therefore, the spacing between the electrode plates and the first main surface of the semiconductor chip can be made as small as 10 to 30 µm and hence it is possible to reduce the thickness of the power MOSFET device 1.

(4) In the power MOSFET device 1 of this first embodiment, the flat plate-like source electrode plate (electrode plate 9) and gate electrode plate (electrode plate 10) are positioned on the lower surface of the sealing member 2 and the drain electrode plate (electrode plate 13) is positioned along the peripheral edge portion of the lower surface of the sealing member 2. Therefore, when the power MOSFET device 1 of this first embodiment is mounted onto a mounting substrate such as a mother board, the heat generated in the semiconductor chip 16 is dissipated to the mounting substrate through the electrode plates 9, 10 and 13. The surface 11 of the central portion of the drain electrode plate (electrode plate 13) is exposed to the upper surface 8 of the sealing member 2. Further, heat dissipating fins are attached to the power MOSFET device 1 mounted on the mounting substrate. More specifically, the heat dissipating fins are mounted onto the drain electrode plate (electrode plate 13) which is exposed to the upper surface 8 of the sealing member 2. As a result, heat dissipation can be effected from both upper and lower surfaces of the sealing member 2, thus affording the power MOSFET 1 superior in heat dissipating performance.

(5) The source electrode 33 and the gate electrode 36 are connected to the source electrode terminal 4 and the gate electrode terminal 5 through the bump electrodes 17 and adhesive 18, and the direction of the connection is a straight line direction. Therefore, an electric current path is shortened and it is possible to attain a decrease of ON resistance.

(6) In this embodiment, since the stud type bump electrodes are formed on the electrodes (source electrode 33 and gate electrode 36), it is no longer necessary to form an under-barrier metal layer which causes an increase of the manufacturing cost.

(7) In this first embodiment, since an under-barrier metal layer is not used on electrode surfaces, it is possible to reduce the product cost in comparison with the structure wherein electrodes (source electrode 33 and gate electrode 36) having an under-barrier metal layer on surfaces thereof and the electrode plates 9, 10 are connected together through the adhesive 18 (silver paste).

(Second Embodiment)

Figure 19:
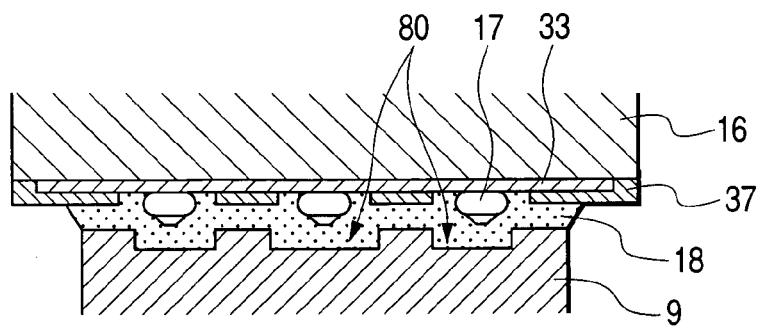
FIG. 19 is a schematic enlarged sectional view showing a part of a semiconductor device according to another embodiment (second embodiment) of the present invention.

FIG. 19 is an enlarged sectional view showing a part of a power MOSFET device 1 according to another embodiment (second embodiment) of the present invention.

According to the structure of this second embodiment, the distance between the first main surface of the semiconductor chip 16 which surface has the source electrode 33 and the gate electrode 36 and corresponding surfaces of the electrode plates 9, 10 can be made shorter. More specifically, recesses 80 are formed in the surfaces of the electrode plates 9 and 10 so as to confront bump electrodes 17. The depth of each recess 80 can be selected relatively freely because the electrode plate thickness is 0.2 mm. For example, by setting the depth of each recess 80 at a value of about 20 to 30 μm, it is possible to keep the bump electrodes 17 out of contact with the electrode plates 9 and 10. As a result, when the semiconductor chip 16 and the electrode plates 9, 10 are connected together during manufacture of the power MOSFET device 1, there is no fear of cracking or breaking of the semiconductor chip 16 no more. FIG. 19 illustrates a state of connection between the source electrode 33 and the electrode plates 9, 10.

(Third Embodiment)

Figure 20:
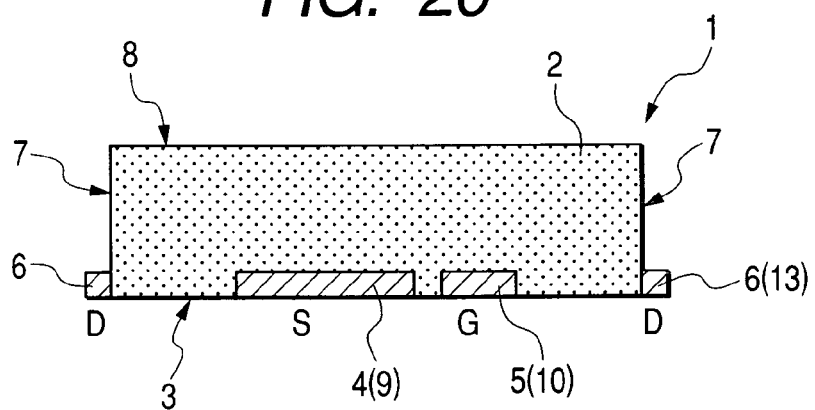
FIG. 20 is a schematic front view of a semiconductor device according to a further embodiment (third embodiment) of the present invention.
Figure 21:
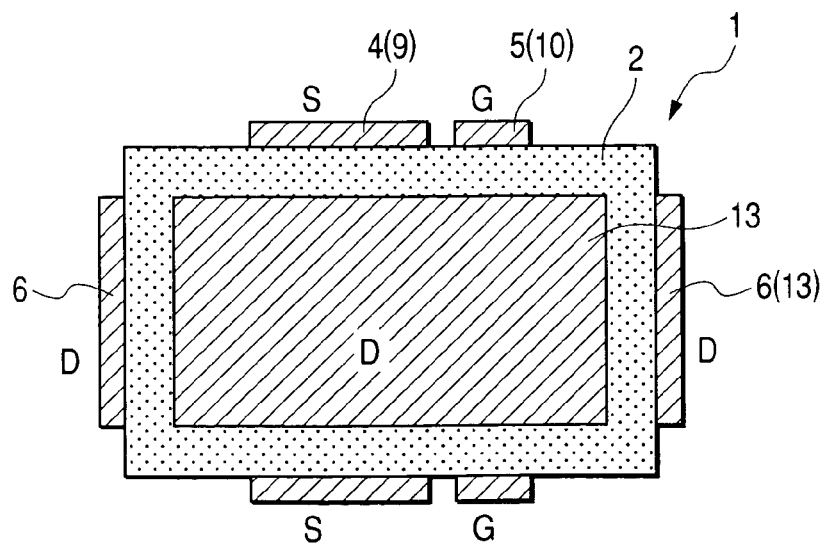
FIG. 21 is a schematic plan view of the semiconductor device of the third embodiment.
Figure 22:
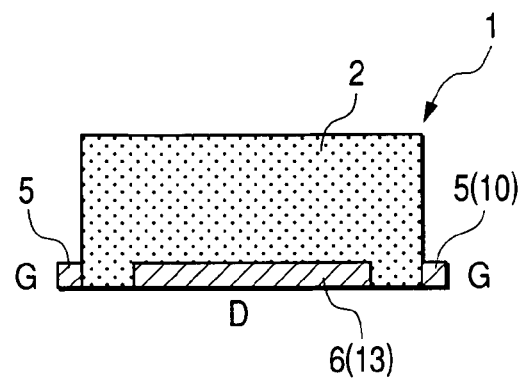
FIG. 22 is a schematic side view of the semiconductor device of the third embodiment.
Figure 23:
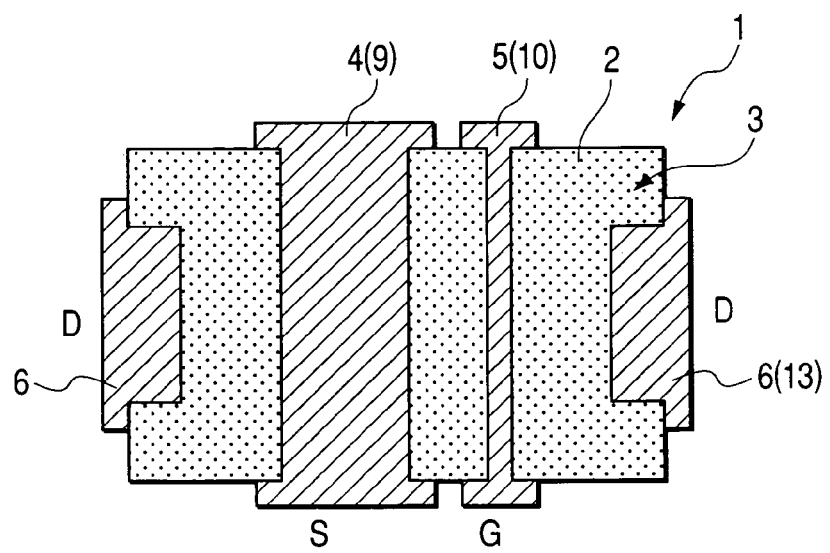
FIG. 23 is a schematic bottom view of the semiconductor device of the third embodiment.

FIGS. 20 to 23 are related to a power MOSFET 1 according to a further embodiment (third embodiment) of the present invention, of which FIG. 20 is a schematic front view, FIG. 21 is a schematic plan view, FIG. 22 is a schematic side view, and FIG. 23 is a schematic bottom view, of the power MOSFET device 1.

In the power MOSFET 1 of this third embodiment, both ends of the electrode plate 13 in the power MOSFET device 1 of the first embodiment are not branched but the electrode plate 13 is used as a single drain electrode terminal 6. According to this structure, since both ends of the electrode plate 13 are flat, the area of heat dissipation increases and the heat dissipating performance of the power MOSFET device 1 is improved.

In this third embodiment, electrode plate portions projecting from side faces of the sealing member 2 are illustrated so as to be wider than the portion sealed with the sealing member. Actually, however, each electrode plate is a flat plate of a predetermined certain width and electrode plate portions illustrated as narrow portions are covered portions with resin which constitutes the sealing member 2. The hidden portions are half-etched portions. Consequently, the electrode plates are difficult to be peeled off from the sealing member 2.

(Fourth Embodiment)

Figure 24:
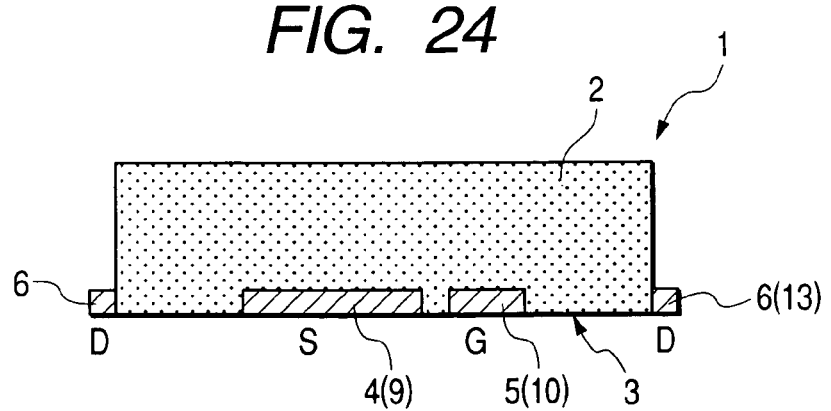
FIG. 24 is a schematic front view of a semiconductor device according to a still further embodiment (fourth embodiment) of the present invention.
Figure 25:
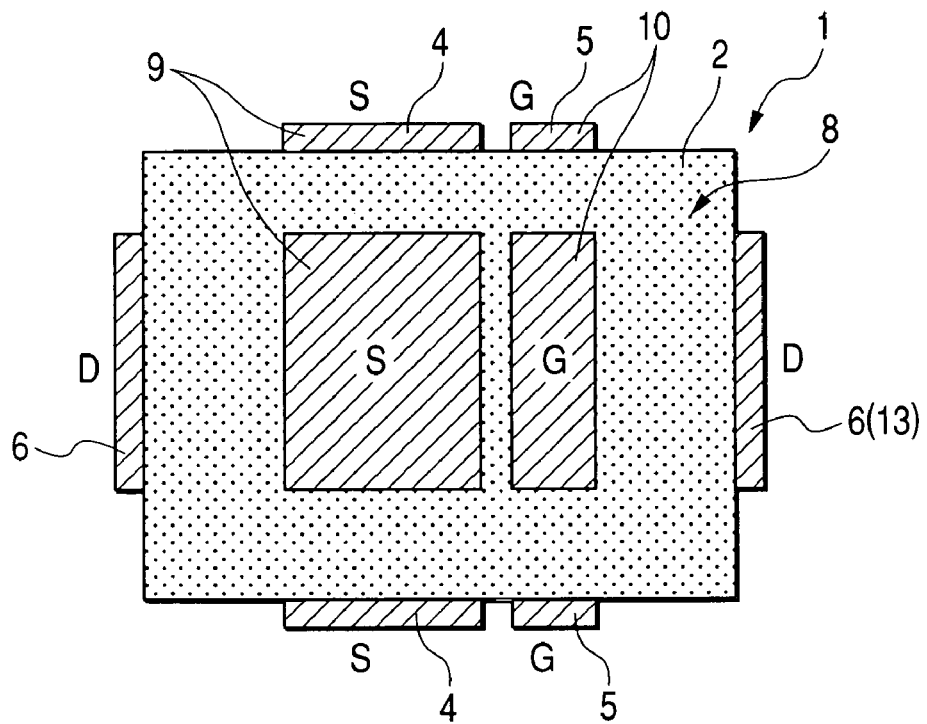
FIG. 25 is a schematic plan view of the semiconductor device of the fourth embodiment.
Figure 26:
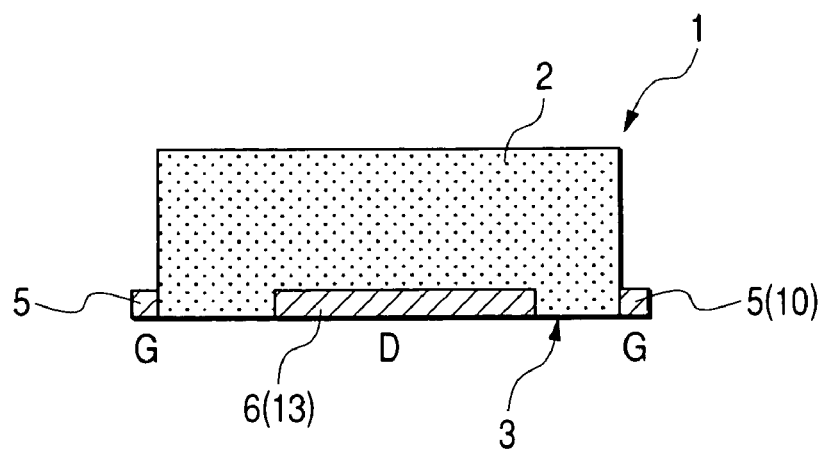
FIG. 26 is a schematic side view of the semiconductor device of the fourth embodiment.
Figure 27:
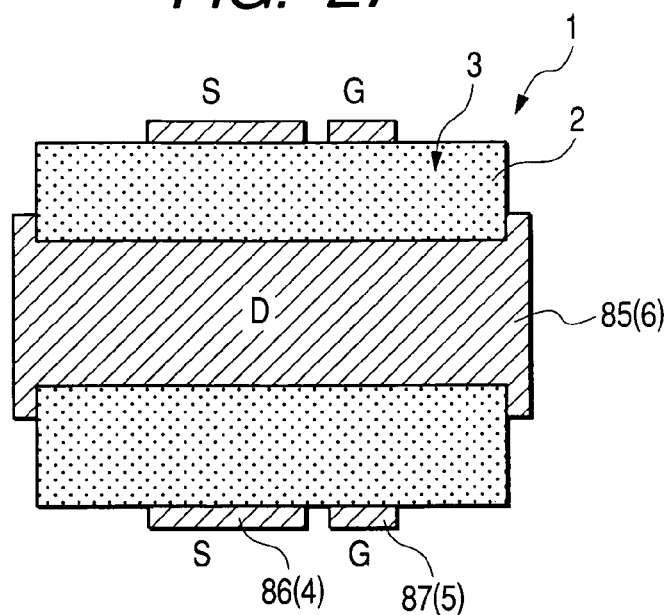
FIG. 27 is a schematic bottom view of the semiconductor device of the fourth embodiment.
Figure 28:
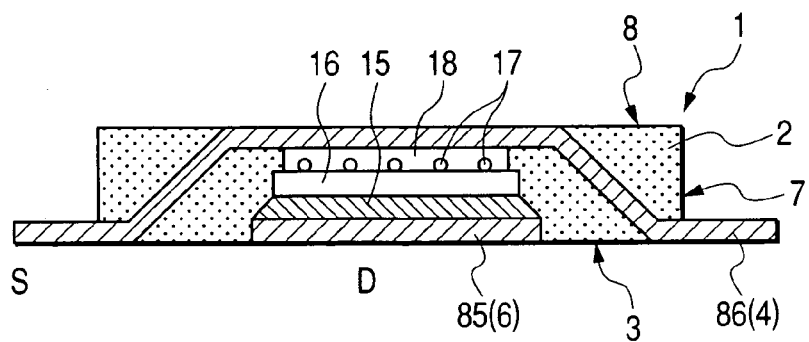
FIG. 28 is a schematic sectional view of the semiconductor device of the fourth embodiment.
Figure 29:
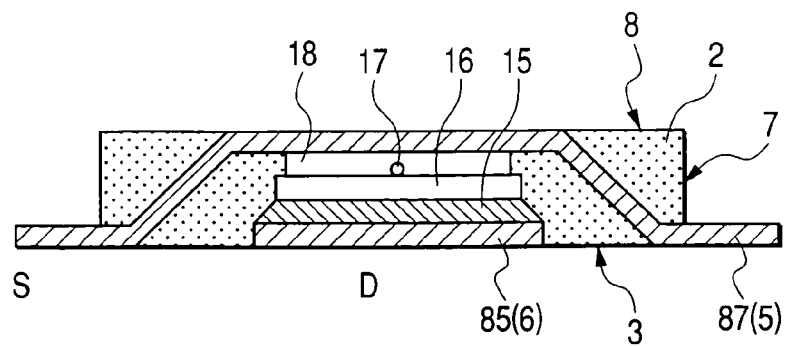
FIG. 29 is a schematic sectional view of the semiconductor device of the fourth embodiment.

FIGS. 24 to 29 illustrate a power MOSFET device 1 according to a further embodiment (fourth embodiment) of the present invention, of which FIG. 24 is a schematic front view, FIG. 25 is a schematic plan view, FIG. 26 is a schematic side view, FIG. 27 is a schematic bottom view, and FIG. 28 is a schematic sectional view, of the power MOSFET 1.

In the power MOSFET 1 of this fourth embodiment, the state of connection of the semiconductor 1 in the power MOSFET 1 of the first embodiment is reversed. More specifically, a flat electrode plate 85 having a lower surface exposed to the lower surface of the sealing member 2 is used as a drain electrode plate (drain electrode terminal 6). Further, two electrode plates 86 and 87 having upper surfaces exposed to the central portion of the upper surface 8 of the sealing member 2 and also having lower surfaces of end portions thereof exposed to a peripheral edge portion of the lower surface 3 of the sealing member 2 are used as a source electrode plate (source electrode terminal 4) and a gate electrode plate (gate electrode terminal 5), respectively.

For manufacturing the power MOSFET 1 of this fourth embodiment, in the lead frame providing step in the first embodiment, two electrode plates 86 and 87 are formed in the first lead frame used in the first embodiment, while one electrode plate 85 is formed in the second lead frame.

Then, in the chip bonding step, the second main surface of the semiconductor chip 16 is connected to the electrode plate 85 through the adhesive 15.

Further, in the bump electrode forming step and the electrode plate connecting step, bump electrodes 17 are formed on the source electrode 33 and the gate electrode 36 which are formed on the first main surface of the semiconductor chip 16, then the bump electrodes 17 are connected to the electrode plates 86 and 87 through the adhesive 18.

According to the structure of the power MOSFET device 1 of this fourth embodiment, the source electrode plate (source electrode terminal 4) is exposed to the upper surface of the sealing member 2. The source electrode plate becomes the highest in temperature and heat can be dissipated effectively from the source electrode plate by attaching heat dissipating fins to the upper surface of the sealing member 2. For enhancing the heat dissipating effect on the lower surface, i.e., on the mounting substrate side, of the sealing member 2, it is necessary to adopt a special structure, for example, providing a copper plate high in thermal conductivity onto the mounting substrate. But this is not only troublesome but also costs high. On the other hand, heat dissipation from the upper surface of the sealing member 2 requires a mere mounting of heat dissipating fins as noted above, which is an easy operation.

(Fifth Embodiment)

Figure 30:
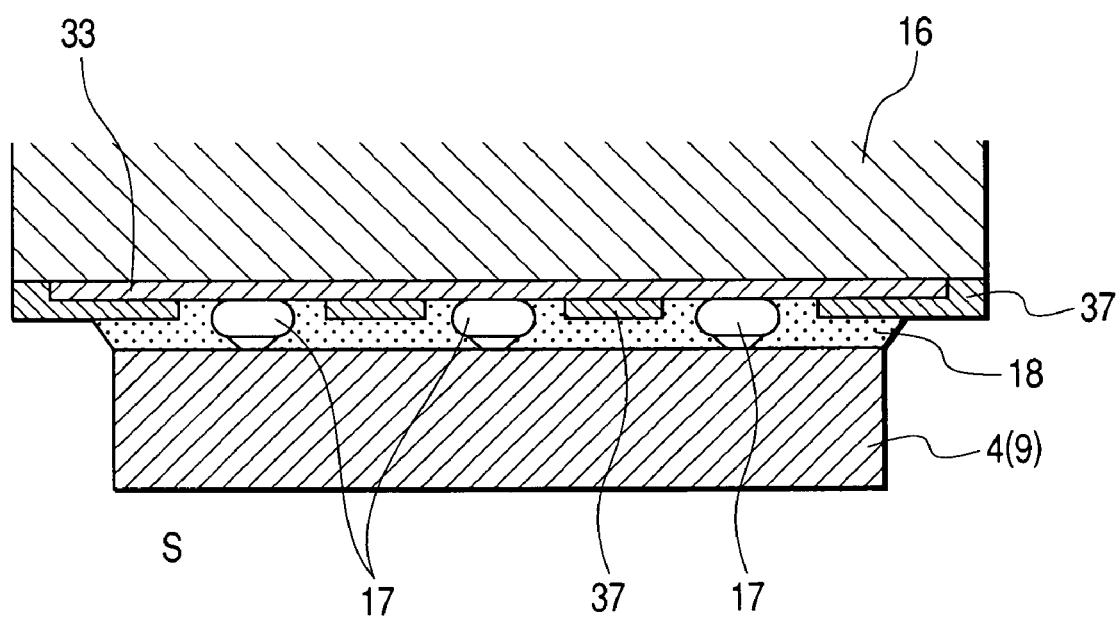
FIG. 30 is a schematic enlarged sectional view of a part of a semiconductor device according to a still further embodiment (fifth embodiment) of the present invention.

FIG. 30 is a schematic enlarged sectional view showing a part of a power MOSFET device 1 according to a still further embodiment (fifth embodiment) of the present invention and FIG. 30 is a view corresponding to FIG. 2 in the first embodiment and showing a state in which the source electrode 33 and the electrode plate 9 are bonded together through the adhesive 18 in the portion of the source electrode plate 9 (source electrode terminal 4).

In this fifth embodiment, the thickness of the adhesive 18 is set at 10 to 20 μm, that is, the spacing between the first main surface of the semiconductor chip 16 and the electrode plate 9 is set at 10 to 30 μm, to attain a further reduction of in thickness of the power MOSFET device 1. In the case where the height of the nail head portion 17a of each bump electrode 17 is controlled to a value of not larger than about 5 μm and the length of the broken portion 17b is controlled to a value of not larger than 5 μm, the height of each bump electrode 17 can be kept to a value of 30 μm or less although the length of the beard portion 17c is beyond control.

As shown in FIG. 30, by adopting the structure wherein the beard portion 17c is brought into direct contact with the semiconductor chip 16, it is possible to narrow the spacing between the first main surface of the semiconductor chip 16 and the electrode plate 9. This spacing can be set at 10 to 30 μm. Thus, it is possible to reduce the thickness of the sealing member 2 and eventually possible to attain the reduction in thickness of the power MOSFET device 1.

Although the present invention has been described concretely on the basis of embodiments thereof, it goes without saying that the invention is not limited to the above embodiments and that various changes may be made within the scope not departing from the gist of the invention. Although in each of the above embodiments a power MOSFET is incorporated into a semiconductor chip, the element to be incorporated into the chip is not limited to the power MOSFET but may be such a transistor as MISFET, power bipolar transistor or IGBT, or a transistor-containing IC. As bump electrodes, those formed using a copper wire are also employable. Although in the above embodiments bump electrodes are formed on a semiconductor chip fixed to electrode plates, bump electrodes may be formed in the state of a semiconductor wafer which is for the fabrication of semiconductor chips, and a semiconductor chip with bump electrodes may be fixed to electrode plates. Even in this case there can be obtained the same effects as in the above embodiments.

Effects obtained by typical modes of the invention as disclosed herein will be outlined below.

(1) It is possible to provide a semiconductor device wherein the breakage of a semiconductor chip is difficult to occur, as well as a method of manufacturing the same.

(2) It is possible to provide a thin semiconductor device and a method of manufacturing the same.

What is claimed is:

1. A semiconductor device comprising:
   a semiconductor chip including a MISFET;
   a source electrode of the MISFET formed on a bottom surface of the semiconductor chip;
   a gate electrode of the MISFET formed on a bottom surface of the semiconductor chip;
   a drain electrode formed on a top surface of the semiconductor chip;
   a drain electrode terminal positioned over the drain electrode and electrically connected with the drain electrode, the drain electrode terminal extending from over the top surface of the semiconductor chip to under the bottom surface of the semiconductor chip;
   a source electrode terminal positioned under the source electrode and electrically connected with the source electrode;
   a gate electrode terminal positioned under the source electrode and electrically connected with the gate electrode; and
   a sealing member sealing the semiconductor chip and parts of the drain, source and gate electrode terminals,
   wherein the source and gate electrode terminals are exposed from a bottom surface of the sealing member,
   the drain electrode terminal are exposed from a top surface and the bottom surface to the sealing member,
   the sealing member has a first side face, a second side face, a third side face and a fourth side face,
   the first and second side faces are opposite each other, and the third and fourth side faces are opposite each other,
   the first side surface of the sealing member connects to the third and fourth side faces of the sealing member, and the second side surface of the sealing member connects to the third and fourth side faces of the sealing member,
   the source and gate electrode terminals are exposed from the first and second side faces of the sealing member, and
   the drain electrode terminal is exposed from the third and fourth side faces of the sealing member.

2. A semiconductor device according to claim 1, wherein the drain electrode terminal is disposed perpendicular to the source and gate electrode terminals in a plan view.

3. A semiconductor device according to claim 1, wherein a source bump electrode is formed on the source electrode, and electrically connected with the source electrode; and
   a gate bump electrode is formed on the gate electrode, and electrically connected with the gate electrode.

4. A semiconductor device according to claim 3, wherein the source and gate bump electrodes are connected with the source and gate electrode terminals respectively through adhesives.

5. A semiconductor device according to claim 1, wherein the drain, source and gate electrode terminals are made of lead frames.

6. A semiconductor device according to claim 1, wherein the sealing member is comprised of an insulating resin.

* * * * *